United States Patent
Lin et al.

(10) Patent No.: US 11,283,414 B2
(45) Date of Patent: Mar. 22, 2022

(54) NEGATIVE FEEDBACK SYSTEM ARCHITECTURE AND LOOP FILTER THEREOF

(71) Applicant: REALTEK SEMICONDUCTOR CORP., Hsinchu (TW)

(72) Inventors: Che-Hung Lin, Hsinchu (TW); Yu-An Lee, Hsinchu (TW)

(73) Assignee: REALTEK SEMICONDUCTOR CORP., Hsinchu (TW)

( * ) Notice: Subject to any disclaimer, the term of this patent is extended or adjusted under 35 U.S.C. 154(b) by 21 days.

(21) Appl. No.: 16/831,031

(22) Filed: Mar. 26, 2020

(65) Prior Publication Data

US 2021/0226591 A1 Jul. 22, 2021

(30) Foreign Application Priority Data

Jan. 21, 2020 (TW) ................................. 109102319

(51) Int. Cl.
| | | |
|---|---|---|
| H03F 3/38 | (2006.01) |
| H03F 1/34 | (2006.01) |
| H03F 3/217 | (2006.01) |
| H03F 3/45 | (2006.01) |

(52) U.S. Cl.
CPC ............... *H03F 1/34* (2013.01); *H03F 3/217* (2013.01); *H03F 3/45475* (2013.01); *H03F 2200/03* (2013.01); *H03F 2203/45174* (2013.01)

(58) Field of Classification Search
CPC .................................. H03F 3/38; H03F 3/217
USPC ........................................ 330/10, 251, 207 A
See application file for complete search history.

(56) References Cited

U.S. PATENT DOCUMENTS

| | | | |
|---|---|---|---|
| 6,909,331 B2 | 6/2005 | Ballantyne | |
| 7,429,940 B2 * | 9/2008 | Melanson | H03M 7/3013 |
| | | | 341/143 |
| 7,994,853 B2 | 8/2011 | Chao | |
| 9,564,862 B2 | 2/2017 | Hyerby | |
| 9,685,919 B2 * | 6/2017 | Yuan | H03F 3/2175 |
| 10,749,544 B2 * | 8/2020 | Kauffman | H03M 1/0607 |
| 2008/0048898 A1 * | 2/2008 | Miller | H03M 3/432 |
| | | | 341/143 |
| 2014/0355790 A1 | 12/2014 | Panov et al. | |
| 2020/0204130 A1 * | 6/2020 | Yuan | H03F 3/2175 |

FOREIGN PATENT DOCUMENTS

WO  WO 2017/037744 A2  3/2017

* cited by examiner

*Primary Examiner* — Henry Choe
(74) *Attorney, Agent, or Firm* — Birch, Stewart, Kolasch & Birch, LLP

(57) ABSTRACT

A negative feedback system architecture and a loop filter thereof are provided. The negative feedback system architecture includes a loop filter, a pulse width modulation circuit, and a driver. The loop filter includes a three-stage series integrator for receiving a signal and outputting the filtered signal. The loop filter has three in-bandwidth poles and at least two in-bandwidth zeros. The pulse width modulation circuit is electrically connected to the loop filter for receiving the filtered signal and modulating it into a pulse width modulation signal to output. The driver is electrically connected to the pulse width modulation circuit and the loop filter for receiving the pulse width modulation signal to generate an output signal to drive a load device, and the output signal is fed back to the loop filter.

13 Claims, 5 Drawing Sheets

NEGATIVE FEEDBACK SYSTEM ARCHITECTURE AND LOOP FILTER THEREOF

CROSS-REFERENCE TO RELATED APPLICATION

This non-provisional application claims priority under 35 U.S.C. § 119(a) to Patent Application No. 109102319 in Taiwan, R.O.C. on Jan. 21, 2020, the entire contents of which are hereby incorporated by reference.

BACKGROUND

Technical Field

The present invention relates to an audio amplifier, and especially, to a negative feedback system architecture with a single feedback path and a loop filter thereof.

Related Art

Existing amplifiers may be divided into a class A amplifier, a class B amplifier, a class AB amplifier, a class C amplifier, and a class D amplifier. Due to the flourishing development of semiconductor technologies, the class D amplifier with low power consumption and high performance has been widely applied to fields of an audio power amplification circuit and the like, to amplify an audio source signal and drive a load speaker.

In the class D audio amplifier, for increasing a signal to noise and distortion ratio (SNDR), a feedback architecture is often used, and a loop gain of the feedback architecture is used to suppress a noise and a distortion. Generally, a higher loop order indicates a larger loop gain and a higher signal to noise and distortion ratio. However, a stability problem often exists. Therefore, it is necessary for the class D audio amplifier to provide a sufficient and stable loop gain.

SUMMARY

In view of this, the present invention provides a negative feedback system architecture, including a loop filter, a pulse width modulation circuit, and a driver. The loop filter includes a three-stage series integrator and is configured to receive a signal and perform filtering to output the filtered signal. The loop filter has three in-bandwidth poles and at least two in-bandwidth zeros. The pulse width modulation circuit is electrically connected to the loop filter and is configured to receive the filtered signal and modulate the filtered signal into a pulse width modulation signal to output the pulse width modulation signal. The driver is electrically connected to the pulse width modulation circuit and the loop filter and is configured to receive the pulse width modulation signal and generate an output signal to drive a load device, and the output signal is fed back to the loop filter.

The present invention additionally provides a loop filter, including a three-stage series integrator, where the three-stage series integrator includes a first-stage integrator, a second-stage integrator, and a third-stage integrator. The first-stage integrator is electrically connected to the second-stage integrator and receives a fed-back output signal, the second-stage integrator is electrically connected to the third-stage integrator, and the third-stage integrator is electrically connected to a pulse width modulation circuit. The three-stage series integrator has three in-bandwidth poles and at least two in-bandwidth zeros.

In conclusion, the present invention may obtain an improved and stable loop gain by using a design of the three-stage series integrator cooperating with the in-bandwidth poles and the in-bandwidth zeros, and improve a suppression capability of a loop on a distortion and a noise, so as to obtain better output linearity and anti-noise performance.

DETAILED DESCRIPTION

Figure 1:
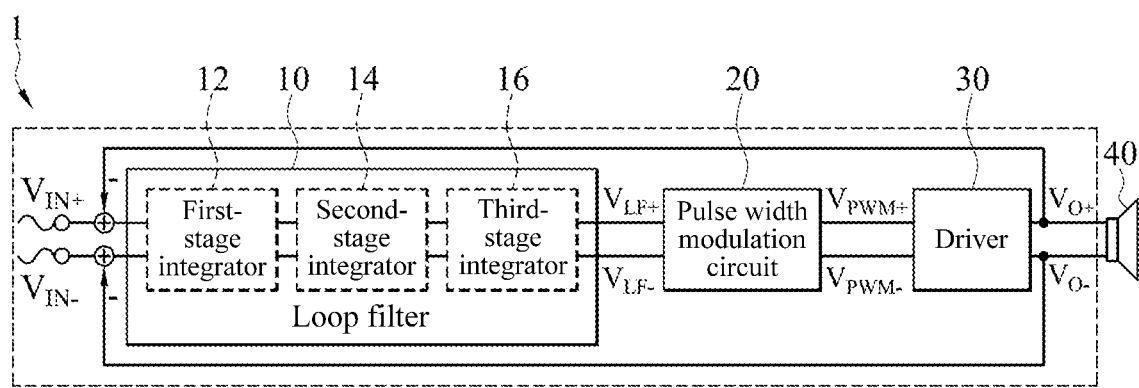
FIG. 1 is a schematic block diagram of an embodiment of a negative feedback system architecture according to the present invention.

FIG. 1 is a schematic block diagram of an embodiment of a negative feedback system architecture according to the present invention. Referring to FIG. 1, a negative feedback system architecture 1 may amplify input signals $V_{IN+}$ and $V_{IN-}$ and drive a speaker 40 as a load device, and the input signals $V_{IN+}$ and $V_{IN-}$ are differential signals. In an embodiment, the negative feedback system architecture 1 is applied to a class D audio amplifier, that is, the present invention may be the negative feedback system architecture in the class D audio amplifier. The negative feedback system architecture 1 includes a loop filter 10, a pulse width modulation circuit 20, and a driver 30. The loop filter 10 includes a three-stage series integrator and is configured to receive signals and perform filtering to output the filtered signals $V_{LF+}$ and $V_{LF-}$. The received signals are the initial input signals $V_{IN+}$ and $V_{IN-}$ or signals obtained by subtracting the input signals $V_{IN+}$ and $V_{IN-}$ from fed-back output signals $V_{O+}$ and $V_{O-}$ after start of feedback. The loop filter 10 has three in-bandwidth poles and at least two in-bandwidth zeros. The three in-bandwidth poles may generate a highest loop gain, and the at least two in-bandwidth zeros may increase a phase, so as to obtain a sufficient phase margin to maintain system stability. The pulse width modulation circuit 20 is electrically connected to the loop filter 10 and is configured to receive the filtered signals $V_{LF+}$ and $V_{LF-}$, and modulate the filtered signals $V_{LF+}$ and $V_{LF-}$ into pulse width modulation signals $V_{PWM+}$ and $V_{PWM-}$ to output the pulse width modulation signals $V_{PWM+}$ and $V_{PWM-}$. The driver 30 is electrically connected to the pulse width modulation circuit 20 and the loop filter 10 and is configured to receive the pulse width modulation signals $V_{PWM+}$ and $V_{PWM-}$. The driver 30 generates, according to the pulse width modulation signals $V_{PWM+}$ and $V_{PWM-}$, output signals $V_{O+}$ and $V_{O-}$ to drive the speaker 40 to play, and the output signals $V_{O+}$ and $V_{O-}$ are further fed back to the loop filter 10, to form a single negative feedback path.

In the loop filter 10, the three-stage series integrator includes a first-stage integrator 12, a second-stage integrator 14, and a third-stage integrator 16, the first-stage integrator 12 is electrically connected to the second-stage integrator 14 and receives the fed-back output signals $V_{O+}$ and $V_{O-}$, the second-stage integrator 14 is electrically connected to the third-stage integrator 16, and the third-stage integrator 16 is electrically connected to the pulse width modulation circuit 20.

FIG. 2(A) to FIG. 2(D) are schematic circuit diagrams of embodiments of a first-stage integrator according to the present invention. Referring to FIG. 2(A) to FIG. 2(D), in an embodiment, the first-stage integrator 12 includes a first differential amplifier 122 and two first resistor-capacitor circuits (RC circuits) 124 and 124'. The first differential amplifier 122 includes a first inverting input end (−), a first non-inverting input end (+), a first inverting output end (−), and a first non-inverting output end (+). One first resistor-capacitor circuit 124 is electrically connected between the first inverting input end (−) and the first non-inverting output end (+) of the first differential amplifier 122, and the other first resistor-capacitor circuit 124' is electrically connected between the first non-inverting input end (+) and the first inverting output end (−) of the first differential amplifier 122. The first resistor-capacitor circuits 124 and 124' are formed by components such as resistors and capacitors, and have different implementation embodiments based on different quantities of components and different connection relationships.

Figure 2A:
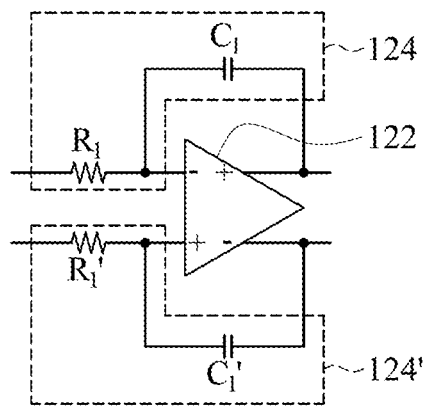
FIG. 2(A) to FIG. 2(D) are schematic circuit diagrams of embodiments of a first-stage integrator according to the present invention.

As shown in FIG. 2(A), the first resistor-capacitor circuit 124 includes a first resistor $R_1$ and a first capacitor $C_1$, the first resistor $R_1$ is electrically connected to the first inverting input end (−) of the first differential amplifier 122, and the first capacitor $C_1$ is electrically connected between the first inverting input end (−) and the first non-inverting output end (+) of the first differential amplifier 122. The other first resistor-capacitor circuit 124' includes a first resistor $R_1'$ and a first capacitor $C_1'$, the first resistor $R_1'$ is electrically connected to the first non-inverting input end (+) of the first differential amplifier 122, and the first capacitor $C_1'$ is electrically connected between the first non-inverting input end (+) and the first inverting output end (−) of the first differential amplifier 122. A transfer function of the first-stage integrator 12 in which the first resistor-capacitor circuit 124 is used is $$TF = \frac{1}{sR_1C_1},$$

and has one in-bandwidth pole.

Figure 2B:
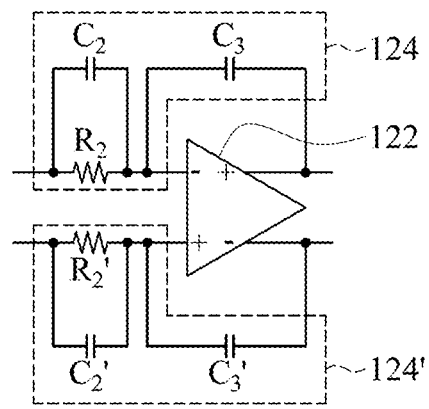

As shown in FIG. 2(B), the first resistor-capacitor circuit 124 includes a second resistor $R_2$, a second capacitor $C_2$, and a third capacitor $C_3$, the second resistor $R_2$ is connected in parallel to the second capacitor $C_2$ and is electrically connected to the first inverting input end (−) of the first differential amplifier 122, and the third capacitor $C_3$ is electrically connected between the first inverting input end (−) and the first non-inverting output end (+) of the first differential amplifier 122. The other first resistor-capacitor circuit 124' includes a second resistor $R_2'$, a second capacitor $C_2'$, and a third capacitor $C_3'$, the second resistor $R_2'$ is connected in parallel to the second capacitor $C_2'$ and is electrically connected to the first non-inverting input end (+) of the first differential amplifier 122, and the third capacitor $C_3'$ is electrically connected between the first non-inverting input end (+) and the first inverting output end (−) of the first differential amplifier 122. A transfer function of the first-stage integrator 12 in which the first resistor-capacitor circuit 124 is used is $$TF = \frac{1 + sR_2C_2}{sR_2C_3},$$

and has one in-bandwidth pole and one in-bandwidth zero.

Figure 2C:
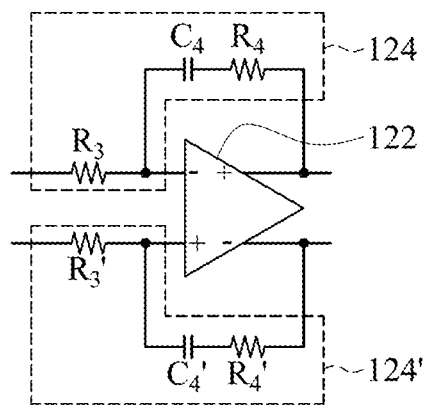

As shown in FIG. 2(C), the first resistor-capacitor circuit 124 includes a third resistor $R_3$, a fourth capacitor $C_4$, and a fourth resistor $R_4$, the third resistor $R_3$ is electrically connected to the first inverting input end (−) of the first differential amplifier 122, and the fourth capacitor $C_4$ is connected in series to the fourth resistor $R_4$ and is electrically connected between the first inverting input end (−) and the first non-inverting output end (+) of the first differential amplifier 122. The other first resistor-capacitor circuit 124' includes a third resistor $R_3'$, a fourth capacitor $C_4'$, and a fourth resistor $R_4'$, the third resistor $R_3'$ is electrically connected to the first non-inverting input end (+) of the first differential amplifier 122, and the fourth capacitor $C_4'$ is connected in series to the fourth resistor $R_4'$ and is electrically connected between the first non-inverting input end (+) and the first inverting output end (−) of the first differential amplifier 122. A transfer function of the first-stage integrator 12 in which the first resistor-capacitor circuit 124 is used is $$TF = \frac{1 + sR_4C_4}{sR_3C_4},$$

and has one in-bandwidth pole and one in-bandwidth zero.

Figure 2D:
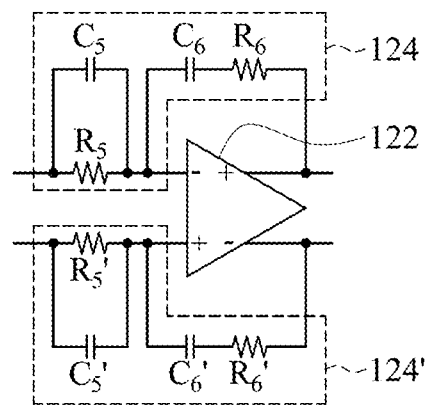

As shown in FIG. 2(D), the first resistor-capacitor circuit 124 includes a fifth resistor $R_5$, a fifth capacitor $C_5$, a sixth resistor $R_6$, and a sixth capacitor $C_6$, the fifth resistor $R_5$ is connected in parallel to the fifth capacitor $C_5$ and is electrically connected to the first inverting input end (−) of the first differential amplifier 122, and the sixth capacitor $C_6$ is connected in series to the sixth resistor $R_6$ and is electrically connected between the first inverting input end (−) and the first non-inverting output end (+) of the first differential amplifier 122. The other first resistor-capacitor circuit 124' includes a fifth resistor $R_5'$, a fifth capacitor $C_5'$, a sixth resistor $R_6'$, and a sixth capacitor $C_6'$, the fifth resistor $R_5'$ is connected in parallel to the fifth capacitor $C_5'$ and is electrically connected to the first non-inverting input end (+) of the first differential amplifier 122, and the sixth capacitor $C_6'$ is connected in series to the sixth resistor $R_6'$ and is electrically connected between the first non-inverting input end (+) and the first inverting output end (−) of the first differential amplifier 122. A transfer function of the first-stage integrator 12 in which the first resistor-capacitor circuit 124 is used is $$TF = \frac{(1 + sR_5C_5)(1 + sR_6C_6)}{sR_5C_6},$$

and has one in-bandwidth pole and two in-bandwidth zeros.

FIG. 3(A) to FIG. 3(D) are schematic circuit diagrams of embodiments of a second-stage integrator according to the present invention. Referring to FIG. 3(A) to FIG. 3(D), in an embodiment, the second-stage integrator 14 includes a second differential amplifier 142 and two second resistor-capacitor circuits 144 and 144'. The second differential amplifier 142 includes a second inverting input end (−), a second non-inverting input end (+), a second inverting output end (−), and a second non-inverting output end (+).

Figure 3A:
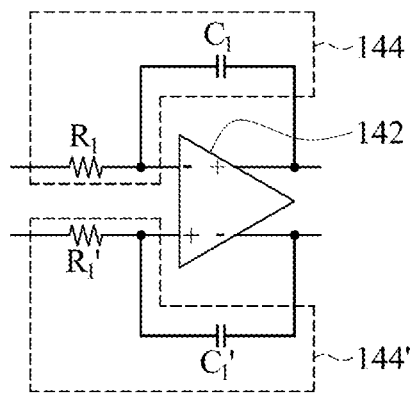
FIG. 3(A) to FIG. 3(D) are schematic circuit diagrams of embodiments of a second-stage integrator according to the present invention.
Figure 3B:
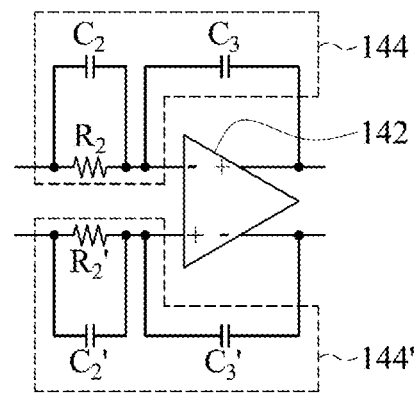
Figure 3C:
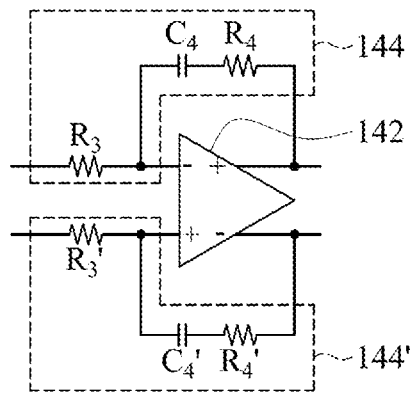
Figure 3D:
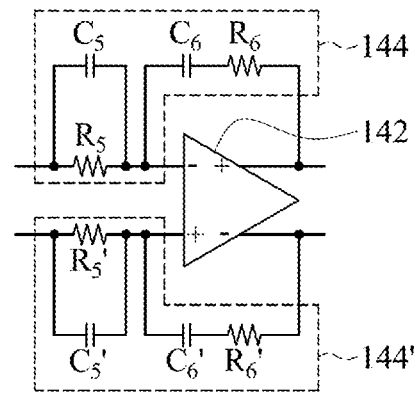

One second resistor-capacitor circuit 144 is electrically connected between the second inverting input end (−) and the second non-inverting output end (+) of the second differential amplifier 142, and the other second resistor-capacitor circuit 144' is electrically connected between the second non-inverting input end (+) and the second inverting output end (−) of the second differential amplifier 142. The second resistor-capacitor circuits 144 and 144' are also formed by components such as resistors and capacitors, and have different implementation embodiments based on different quantities of components and different connection relationships. The implementation embodiments of the second resistor-capacitor circuits 144 and 144' are shown in FIG. 3(A) to FIG. 3(D). In addition to replacing the first differential amplifier 122 and the first resistor-capacitor circuits 124 and 124' shown in FIG. 2(A) to FIG. 2(D) with the second differential amplifier 142 and the second resistor-capacitor circuits 144 and 144', other structures and connection relationships are all the same. Therefore, reference may be made to the previous detailed descriptions, which are not repeated herein. Therefore, a transfer function of the second-stage integrator 14 shown in FIG. 3(A) is $$TF = \frac{1}{sR_1C_1},$$

and has one in-bandwidth pole. A transfer function of the second-stage integrator 14 shown in FIG. 3(B) is $$TF = \frac{1 + sR_2C_2}{sR_2C_3},$$

and has one in-bandwidth pole and one in-bandwidth zero. A transfer function of the second-stage integrator 14 shown in FIG. 3(C) is $$TF = \frac{1 + sR_4C_4}{sR_3C_4},$$

and has one in-bandwidth pole and one in-bandwidth zero. A transfer function of the second-stage integrator 14 shown in FIG. 3(D) is $$TF = \frac{(1 + sR_5C_5)(1 + sR_6C_6)}{sR_5C_6},$$

and has one in-bandwidth pole and two in-bandwidth zeros.

Figure 4A:
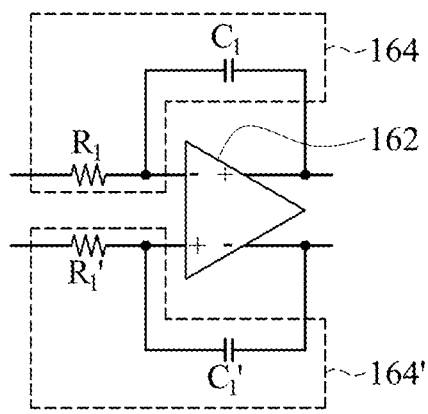
FIG. 4(A) to FIG. 4(D) are schematic circuit diagrams of embodiments of a third-stage integrator according to the present invention.
Figure 4B:
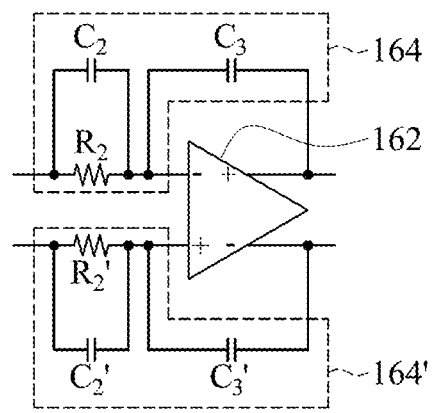
Figure 4C:
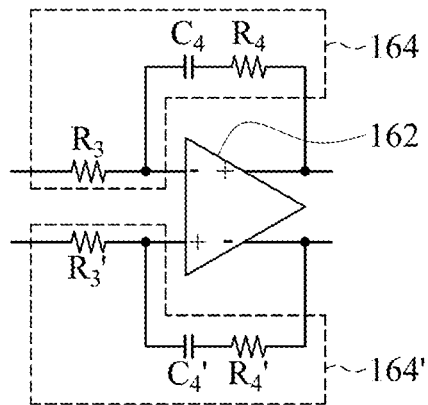
Figure 4D:
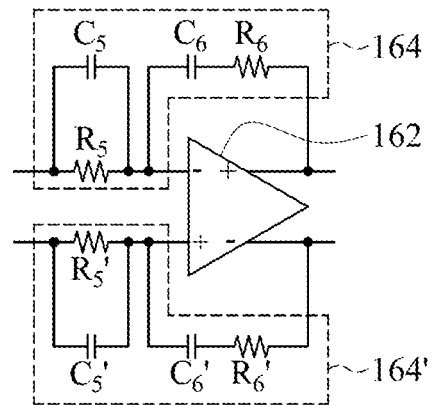

FIG. 4(A) to FIG. 4(D) are schematic circuit diagrams of embodiments of a third-stage integrator according to the present invention. Referring to FIG. 4(A) to FIG. 4(D), in an embodiment, the third-stage integrator 16 includes a third differential amplifier 162 and two third resistor-capacitor circuits 164 and 164'. The third differential amplifier 162 includes a third inverting input end (−), a third non-inverting input end (+), a third inverting output end (−), and a third non-inverting output end (+). One third resistor-capacitor circuit 164 is electrically connected between the third inverting input end (−) and the third non-inverting output end (+) of the third differential amplifier 162, and the other third resistor-capacitor circuit 164' is electrically connected between the third non-inverting input end (+) and the third inverting output end (−) of the third differential amplifier 162. The third resistor-capacitor circuits 164 and 164' are also formed by components such as resistors and capacitors, and have different implementation embodiments based on different quantities of components and different connection relationships. The implementation embodiments of the third resistor-capacitor circuits 164 and 164' are shown in FIG. 4(A) to FIG. 4(D). In addition to replacing the first differential amplifier 122 and the first resistor-capacitor circuits 124 and 124' shown in FIG. 2(A) to FIG. 2(D) with the third differential amplifier 162 and the third resistor-capacitor circuits 164 and 164', other structures and connection relationships are all the same. Therefore, reference may be made to the previous detailed descriptions, which are not repeated herein. Therefore, a transfer function of the third-stage integrator 16 shown in FIG. 4(A) is $$TF = \frac{1}{sR_1C_1},$$

and has one in-bandwidth pole. A transfer function of the third-stage integrator 16 shown in FIG. 4(B) is $$TF = \frac{1 + sR_2C_2}{sR_2C_3},$$

and has one in-bandwidth pole and one in-bandwidth zero. A transfer function of the third-stage integrator 16 shown in FIG. 4(C) is $$TF = \frac{1 + sR_4C_4}{sR_3C_4},$$

and has one in-bandwidth pole and one in-bandwidth zero. A transfer function of the third-stage integrator 16 shown in FIG. 4(D) is $$TF = \frac{(1 + sR_5C_5)(1 + sR_6C_6)}{sR_5C_6},$$

and has one in-bandwidth pole and two in-bandwidth zeros.

In an embodiment, as shown in FIG. 1, the first-stage integrator 12 may be selected from circuit structures shown in FIG. 2(A) to FIG. 2(D), the second-stage integrator 14 may be selected from circuit structures shown in FIG. 3(A) to FIG. 3(D), and the third-stage integrator 16 may be selected from circuit structures shown in FIG. 4(A) to FIG. 4(D). Therefore, the loop filter 10 should theoretically include 4*4*4=64 structure combinations. However, the loop filter 10 needs to have three in-bandwidth poles and at least two in-bandwidth zeros, so that there are 7 structure combinations that each have less than two in-bandwidth zeros and that cannot be used, and the 7 structure combinations include a combination of FIG. 2(A), FIG. 3(A), and FIG. 4(A), a combination of FIG. 2(A), FIG. 3(A), and FIG. 4(B), a combination of FIG. 2(A), FIG. 3(A), and FIG. 4(C), a combination of FIG. 2(A), FIG. 3(B), and FIG. 4(A), a combination of FIG. 2(A), FIG. 3(C), and FIG. 4(A), a combination of FIG. 2(B), FIG. 3(A), and FIG. 4(A), and a combination of FIG. 2(C), FIG. 3(A), and FIG. 4(A). Therefore, there are 57 available structure combinations in total in the loop filter 10.

Figure 5:
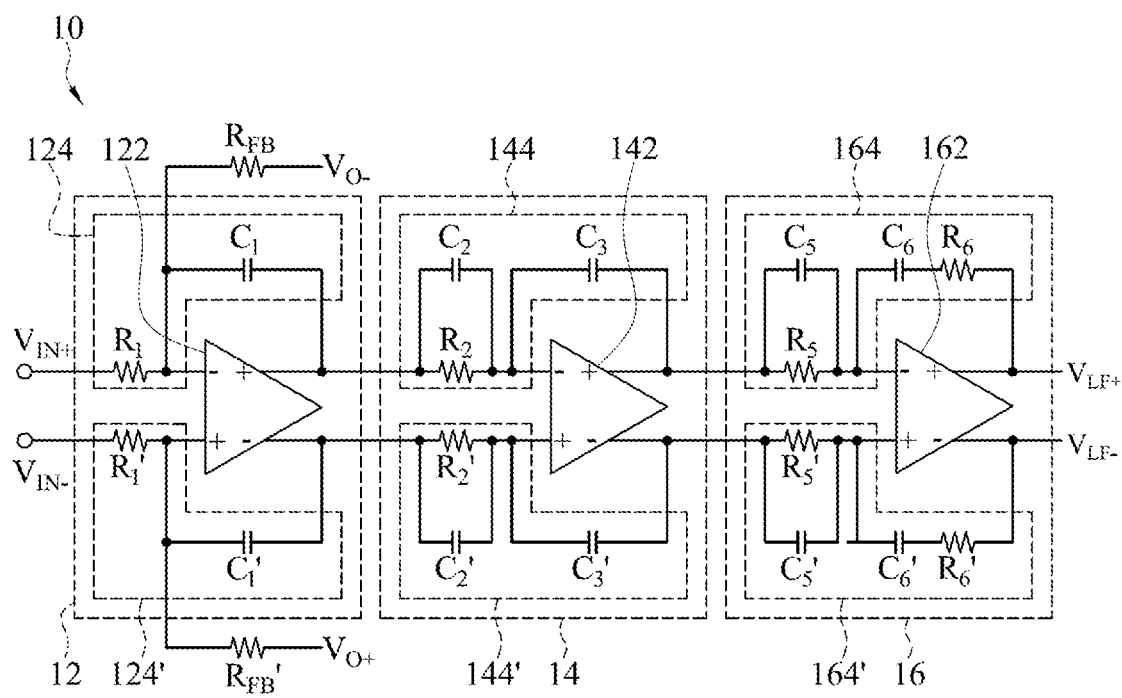
FIG. 5 is a schematic circuit diagram of an embodiment of a loop filter according to the present invention.

FIG. 5 is a schematic circuit diagram of an embodiment of a loop filter according to the present invention. Referring to an embodiment shown in FIG. 5, in the loop filter 10, the present invention selects a structure of FIG. 2(A) as the first-stage integrator 12, a structure of FIG. 3(B) as the second-stage integrator 14, and a structure of FIG. 4(D) as the third-stage integrator 16 to form the three-stage series integrator. As shown in FIG. 5, in the first-stage integrator 12, one end of the first resistor $R_1$ of the first resistor-capacitor circuit 124 is electrically connected to the first inverting input end (−) of the first differential amplifier 122, and the other end receives the input signal $V_{IN+}$. The first capacitor $C_1$ is electrically connected between the first inverting input end (−) and the first non-inverting output end (+) of the first differential amplifier 122. One end of the first resistor $R_1'$ of the first resistor-capacitor circuit 124' is electrically connected to the first non-inverting input end (+) of the first differential amplifier 122, the other end receives the input signal $V_{IN-}$, and the first capacitor $C_1'$ is electrically connected between the first non-inverting input end (+) and the first inverting output end (−) of the first differential amplifier 122. The first inverting input end (−) and the first non-inverting input end (+) of the first differential amplifier 122 are further respectively electrically connected to feedback resistors $R_{FB}$ and $R_{FB}'$ to respectively receive the fed-back output signals $V_{O-}$ and $V_{O+}$. In the second-stage integrator 14, the second resistor $R_2$ of the second resistor-capacitor circuit 144 is connected in parallel to the second capacitor $C_2$ and is electrically connected between the first non-inverting output end (+) of the first differential amplifier 122 and the second inverting input end (−) of the second differential amplifier 142. The third capacitor $C_3$ is electrically connected between the second inverting input end (−) and the second non-inverting output end (+) of the second differential amplifier 142. Similarly, the second resistor $R_2'$ of the second resistor-capacitor circuit 144' is connected in parallel to the second capacitor $C_2'$ and is electrically connected between the first inverting output end (−) of the first differential amplifier 122 and the second non-inverting input end (+) of the second differential amplifier 142, and the third capacitor $C_3'$ is electrically connected between the second non-inverting input end (+) and the second inverting output end (−) of the second differential amplifier 142. In the third-stage integrator 16, the fifth resistor $R_5$ of the third resistor-capacitor circuit 164 is connected in parallel to the fifth capacitor $C_5$ and is electrically connected between the second non-inverting output end (+) of the second differential amplifier 142 and the third inverting input end (−) of the third differential amplifier 162. The sixth capacitor $C_6$ is connected in series to the sixth resistor $R_6$ and is electrically connected between the third inverting input end (−) and the third non-inverting output end (+) of the third differential amplifier 162. The fifth resistor $R_5'$ of the third resistor-capacitor circuit 164' is connected in parallel to the fifth capacitor $C_5'$ and is electrically connected between the second inverting output end (−) of the second differential amplifier 142 and the third non-inverting input end (+) of the third differential amplifier 162. The sixth capacitor $C_6'$ is connected in series to the sixth resistor $R_6'$ and is electrically connected between the third non-inverting input end (+) and the third inverting output end (−) of the third differential amplifier 162. Therefore, the third non-inverting output end (+) and the third inverting output end (−) of the third differential amplifier 162 may respectively output the filtered signals $V_{LF+}$ and $V_{LF-}$.

Based on the foregoing, a loop transfer function of the loop filter 10 may be represented as $$LTF = \frac{(1+sR_2C_2)(1+sR_5C_5)(1+sR_6C_6)}{s^3 R_{FB}C_1 R_2 C_3 R_5 C_6}.$$

Therefore, the loop filter 10 has three in-bandwidth poles and three in-bandwidth zeros. The three in-bandwidth poles may enable the loop filter 10 to have a slope of −20*3=−60 dB/decade in the in-bandwidth to generate a highest in-bandwidth loop gain, and the three in-bandwidth zeros may obtain a higher phase margin.

Certainly, the loop filter 10 shown in FIG. 5 is merely an example, and the present invention is not limited thereto. Any circuit design in which the first-stage integrator 12, the second-stage integrator 14, and the third-stage integrator 16 required for the loop filter 10 are connected in series and a requirement of the three in-bandwidth poles and the at least two in-bandwidth zeros is satisfied falls within the scope of the present invention.

Therefore, the present invention may obtain the improved and stable loop gain by using the design of the three-stage series integrator (the first-stage integrator, the second-stage integrator, and the third-stage integrator) cooperating with the three in-bandwidth poles and the at least two in-bandwidth zeros, and improve a suppression capability of the loop on the distortion and the noise, so as to obtain better output linearity and anti-noise performance.

Although the present invention has been described in considerable detail with reference to certain preferred embodiments thereof, the disclosure is not for limiting the scope of the invention. Persons having ordinary skill in the art may make various modifications and changes without departing from the scope and spirit of the invention. Therefore, the scope of the appended claims should not be limited to the description of the preferred embodiments described above.

What is claimed is:

1. A negative feedback system architecture, comprising:
a loop filter, comprising a three-stage series integrator, and configured to receive a signal and perform filtering to output the filtered signal, wherein the loop filter has three in-bandwidth poles and at least two in-bandwidth zeros;
a pulse width modulation circuit, electrically connected to the loop filter, and configured to receive the filtered signal and modulate the filtered signal into a pulse width modulation signal to output the pulse width modulation signal; and
a driver, electrically connected to the pulse width modulation circuit and the loop filter, and configured to receive the pulse width modulation signal and generate an output signal to drive a load device, wherein the output signal is fed back to the loop filter,
wherein the three-stage series integrator comprises a first-stage integrator, a second-stage integrator, and a third-stage integrator, the first-stage integrator is electrically connected to the second-stage integrator and receives the fed-back output signal, the second-stage integrator is electrically connected to the third-stage integrator, and the third-stage integrator is electrically connected to the pulse width modulation circuit, and
wherein the first-stage integrator further comprises:
a first differential amplifier, comprising a first inverting input end, a first non-inverting input end, a first inverting output end, and a first non-inverting output end; and two first resistor-capacitor circuits, wherein one first resistor-capacitor circuit is electrically connected to the first inverting input end and the first non-inverting output end of the first differential amplifier, and the other first resistor-capacitor circuit is electrically connected to the first non-inverting input end and the first inverting output end of the first differential amplifier.

2. The negative feedback system architecture according to claim 1, wherein the first resistor-capacitor circuit is selected from one of the following:
  a first resistor and a first capacitor, wherein the first resistor is electrically connected to the first inverting input end or the first non-inverting input end, and the first capacitor is electrically connected between the first inverting input end and the first non-inverting output end or between the first non-inverting input end and the first inverting output end;
  a second resistor, a second capacitor, and a third capacitor, wherein the second resistor is connected in parallel to the second capacitor and is electrically connected to the first inverting input end or the first non-inverting input end, and the third capacitor is electrically connected between the first inverting input end and the first non-inverting output end or between the first non-inverting input end and the first inverting output end;
  a third resistor, a fourth capacitor, and a fourth resistor, wherein the third resistor is electrically connected to the first inverting input end or the first non-inverting input end, and the fourth capacitor is connected in series to the fourth resistor and is electrically connected between the first inverting input end and the first non-inverting output end or between the first non-inverting input end and the first inverting output end; and
  a fifth resistor, a fifth capacitor, a sixth resistor, and a sixth capacitor, wherein the fifth resistor is connected in parallel to the fifth capacitor and is electrically connected to the first inverting input end or the first non-inverting input end, and the sixth capacitor is connected in series to the sixth resistor and is electrically connected between the first inverting input end and the first non-inverting output end or between the first non-inverting input end and the first inverting output end.

3. The negative feedback system architecture according to claim 1, wherein the second-stage integrator further comprises:
  a second differential amplifier, comprising a second inverting input end, a second non-inverting input end, a second inverting output end, and a second non-inverting output end; and
  two second resistor-capacitor circuits, wherein one second resistor-capacitor circuit is electrically connected to the second inverting input end and the second non-inverting output end of the second differential amplifier, and the other second resistor-capacitor circuit is electrically connected to the second non-inverting input end and the second inverting output end of the second differential amplifier.

4. The negative feedback system architecture according to claim 3, wherein the second resistor-capacitor circuit is selected from one of the following:
  a first resistor and a first capacitor, wherein the first resistor is electrically connected to the second inverting input end or the second non-inverting input end, and the first capacitor is electrically connected between the second inverting input end and the second non-inverting output end or between the second non-inverting input end and the second inverting output end;
  a second resistor, a second capacitor, and a third capacitor, wherein the second resistor is connected in parallel to the second capacitor and is electrically connected to the second inverting input end or the second non-inverting input end, and the third capacitor is electrically connected between the second inverting input end and the second non-inverting output end or between the second non-inverting input end and the second inverting output end;
  a third resistor, a fourth capacitor, and a fourth resistor, wherein the third resistor is electrically connected to the second inverting input end or the second non-inverting input end, and the fourth capacitor is connected in series to the fourth resistor and is electrically connected between the second inverting input end and the second non-inverting output end or between the second non-inverting input end and the second inverting output end; and
  a fifth resistor, a fifth capacitor, a sixth resistor, and a sixth capacitor, wherein the fifth resistor is connected in parallel to the fifth capacitor and is electrically connected to the second inverting input end or the second non-inverting input end, and the sixth capacitor is connected in series to the sixth resistor and is electrically connected between the second inverting input end and the second non-inverting output end or between the second non-inverting input end and the second inverting output end.

5. The negative feedback system architecture according to claim 1, wherein the third-stage integrator further comprises:
  a third differential amplifier, comprising a third inverting input end, a third non-inverting input end, a third inverting output end, and a third non-inverting output end; and
  two third resistor-capacitor circuits, wherein one third resistor-capacitor circuit is electrically connected to the third inverting input end and the third non-inverting output end of the third differential amplifier, and the other third resistor-capacitor circuit is electrically connected to the third non-inverting input end and the third inverting output end of the third differential amplifier.

6. The negative feedback system architecture according to claim 5, wherein the third resistor-capacitor circuit is selected from one of the following:
  a first resistor and a first capacitor, wherein the first resistor is electrically connected to the third inverting input end or the third non-inverting input end, and the first capacitor is electrically connected between the third inverting input end and the third non-inverting output end or between the third non-inverting input end and the third inverting output end;
  a second resistor, a second capacitor, and a third capacitor, wherein the second resistor is connected in parallel to the second capacitor and is electrically connected to the third inverting input end or the third non-inverting input end, and the third capacitor is electrically connected between the third inverting input end and the third non-inverting output end or between the third non-inverting input end and the third inverting output end;
  a third resistor, a fourth capacitor, and a fourth resistor, wherein the third resistor is electrically connected to the third inverting input end or the third non-inverting input end, and the fourth capacitor is connected in series to the fourth resistor and is electrically connected between the third inverting input end and the third non-inverting output end or between the third non-inverting input end and the third inverting output end; and a fifth resistor, a fifth capacitor, a sixth resistor, and a sixth capacitor, wherein the fifth resistor is connected in parallel to the fifth capacitor and is electrically connected to the third inverting input end or the third non-inverting input end, and the sixth capacitor is connected in series to the sixth resistor and is electrically connected between the third inverting input end and the third non-inverting output end or between the third non-inverting input end and the third inverting output end.

7. The negative feedback system architecture according to claim 1, wherein the load device is a speaker.

8. A loop filter, comprising a three-stage series integrator, wherein the three-stage series integrator comprises a first-stage integrator, a second-stage integrator, and a third-stage integrator, the first-stage integrator is electrically connected to the second-stage integrator and receives a fed-back output signal, the second-stage integrator is electrically connected to the third-stage integrator, the third-stage integrator is electrically connected to a pulse width modulation circuit, and the three-stage series integrator has three in-bandwidth poles and at least two in-bandwidth zeros, wherein the first-stage integrator further comprises:
a first differential amplifier, comprising a first inverting input end, a first non-inverting input end, a first inverting output end, and a first non-inverting output end; and
two first resistor-capacitor circuits, wherein one first resistor-capacitor circuit is electrically connected to the first inverting input end and the first non-inverting output end of the first differential amplifier, and the other first resistor-capacitor circuit is electrically connected to the first non-inverting input end and the first inverting output end of the first differential amplifier.

9. The loop filter according to claim 8, wherein the first resistor-capacitor circuit is selected from one of the following:
a first resistor and a first capacitor, wherein the first resistor is electrically connected to the first inverting input end or the first non-inverting input end, and the first capacitor is electrically connected between the first inverting input end and the first non-inverting output end or between the first non-inverting input end and the first inverting output end;
a second resistor, a second capacitor, and a third capacitor, wherein the second resistor is connected in parallel to the second capacitor and is electrically connected to the first inverting input end or the first non-inverting input end, and the third capacitor is electrically connected between the first inverting input end and the first non-inverting output end or between the first non-inverting input end and the first inverting output end;
a third resistor, a fourth capacitor, and a fourth resistor, wherein the third resistor is electrically connected to the first inverting input end or the first non-inverting input end, and the fourth capacitor is connected in series to the fourth resistor and is electrically connected between the first inverting input end and the first non-inverting output end or between the first non-inverting input end and the first inverting output end; and
a fifth resistor, a fifth capacitor, a sixth resistor, and a sixth capacitor, wherein the fifth resistor is connected in parallel to the fifth capacitor and is electrically connected to the first inverting input end or the first non-inverting input end, and the sixth capacitor is connected in series to the sixth resistor and is electrically connected between the first inverting input end and the first non-inverting output end or between the first non-inverting input end and the first inverting output end.

10. The loop filter according to claim 8, wherein the second-stage integrator further comprises:
a second differential amplifier, comprising a second inverting input end, a second non-inverting input end, a second inverting output end, and a second non-inverting output end; and
two second resistor-capacitor circuits, wherein one second resistor-capacitor circuit is electrically connected to the second inverting input end and the second non-inverting output end of the second differential amplifier, and the other second resistor-capacitor circuit is electrically connected to the second non-inverting input end and the second inverting output end of the second differential amplifier.

11. The loop filter according to claim 10, wherein the second resistor-capacitor circuit is selected from one of the following:
a first resistor and a first capacitor, wherein the first resistor is electrically connected to the second inverting input end or the second non-inverting input end, and the first capacitor is electrically connected between the second inverting input end and the second non-inverting output end or between the second non-inverting input end and the second inverting output end;
a second resistor, a second capacitor, and a third capacitor, wherein the second resistor is connected in parallel to the second capacitor and is electrically connected to the second inverting input end or the second non-inverting input end, and the third capacitor is electrically connected between the second inverting input end and the second non-inverting output end or between the second non-inverting input end and the second inverting output end;
a third resistor, a fourth capacitor, and a fourth resistor, wherein the third resistor is electrically connected to the second inverting input end or the second non-inverting input end, and the fourth capacitor is connected in series to the fourth resistor and is electrically connected between the second inverting input end and the second non-inverting output end or between the second non-inverting input end and the second inverting output end; and
a fifth resistor, a fifth capacitor, a sixth resistor, and a sixth capacitor, wherein the fifth resistor is connected in parallel to the fifth capacitor and is electrically connected to the second inverting input end or the second non-inverting input end, and the sixth capacitor is connected in series to the sixth resistor and is electrically connected between the second inverting input end and the second non-inverting output end or between the second non-inverting input end and the second inverting output end.

12. The loop filter according to claim 8, wherein the third-stage integrator further comprises:

a third differential amplifier, comprising a third inverting input end, a third non-inverting input end, a third inverting output end, and a third non-inverting output end; and two third resistor-capacitor circuits, wherein one third resistor-capacitor circuit is electrically connected to the third inverting input end and the third non-inverting output end of the third differential amplifier, and the other third resistor-capacitor circuit is electrically connected to the third non-inverting input end and the third inverting output end of the third differential amplifier.

13. The loop filter according to claim 12, wherein the third resistor-capacitor circuit is selected from one of the following:

a first resistor and a first capacitor, wherein the first resistor is electrically connected to the third inverting input end or the third non-inverting input end, and the first capacitor is electrically connected between the third inverting input end and the third non-inverting output end or between the third non-inverting input end and the third inverting output end;

a second resistor, a second capacitor, and a third capacitor, wherein the second resistor is connected in parallel to the second capacitor and is electrically connected to the third inverting input end or the third non-inverting input end, and the third capacitor is electrically connected between the third inverting input end and the third non-inverting output end or between the third non-inverting input end and the third inverting output end;

a third resistor, a fourth capacitor, and a fourth resistor, wherein the third resistor is electrically connected to the third inverting input end or the third non-inverting input end, and the fourth capacitor is connected in series to the fourth resistor and is electrically connected between the third inverting input end and the third non-inverting output end or between the third non-inverting input end and the third inverting output end; and a fifth resistor, a fifth capacitor, a sixth resistor, and a sixth capacitor, wherein the fifth resistor is connected in parallel to the fifth capacitor and is electrically connected to the third inverting input end or the third non-inverting input end, and the sixth capacitor is connected in series to the sixth resistor and is electrically connected between the third inverting input end and the third non-inverting output end or between the third non-inverting input end and the third inverting output end.

* * * * *